United States Patent [19]
Onabe et al.

[11] Patent Number: 5,908,507
[45] Date of Patent: Jun. 1, 1999

[54] CHEMICAL VAPOR DEPOSITION REACTOR AND METHOD OF PRODUCING OXIDE SUPERCONDUCTIVE CONDUCTOR USING THE SAME

[75] Inventors: Kazunori Onabe; Nobuyuki Sadakata; Takashi Saito; Osamu Kohno; Taichi Yamaguchi; Yasuhiro Iijima, all of Tokyo; Shigeo Nagaya; Naoki Hirano, both of Nagoya, all of Japan

[73] Assignees: Fujikura Ltd., Tokyo; Chubu Electric Power Company Inc., Nagoya, both of Japan

[21] Appl. No.: 08/889,178

[22] Filed: Jul. 7, 1997

Related U.S. Application Data

[63] Continuation of application No. 08/516,193, Aug. 17, 1995, abandoned.

[30] Foreign Application Priority Data

May 22, 1995 [JP] Japan ................................ 7-122891

[51] Int. Cl.⁶ .................................................. C23C 16/00
[52] U.S. Cl. ............................ 118/718; 118/719; 118/725
[58] Field of Search .................................. 118/718, 719, 118/725; 505/473

[56] References Cited

U.S. PATENT DOCUMENTS

| | | | |
|---|---|---|---|
| 3,785,853 | 1/1974 | Kirkman | 118/719 |
| 4,389,970 | 6/1983 | Edgerton | 118/718 |
| 4,732,110 | 3/1988 | Parsons | 118/725 |
| 4,763,601 | 8/1988 | Saida | 118/718 |
| 4,986,216 | 1/1991 | Ohmori | 118/725 |
| 5,034,372 | 7/1991 | Matsuno et al. . | |
| 5,273,954 | 12/1993 | Takano | 505/730 |
| 5,356,474 | 10/1994 | Savkar | 118/718 |
| 5,378,283 | 1/1995 | Ushikawa | 118/725 |

FOREIGN PATENT DOCUMENTS 398374  11/1990  European Pat. Off. .

OTHER PUBLICATIONS

Li et al. J. Appl. Phys. 71 (5), Mar. 1, 1992.

*Primary Examiner*—Richard Bueker
*Attorney, Agent, or Firm*—Sughrue, Mion, Zinn, Macpeak & Seas, PLLC

[57] ABSTRACT

A chemical vapor deposition (CVD) reactor for forming a film at the surface of a base material, and a production method for an oxide superconductive conductor using this CVD reactor, are disclosed. The CVD reactor is provided with a processing chamber, a material gas supply mechanism which supplies material gas into the processing chamber, and a gas exhaust mechanism which vents gas from inside the processing chamber. The processing chamber is divided by partitions into a base material introduction section, a reaction chamber, and a base material guide-out section. A base material transit opening is formed in each partition, and a base material conveyance region is formed inside the reaction chamber passing through the base material introduction section, the reaction chamber and the base material guide-out section. The material gas supply mechanism is provided with a material gas supply source and a gas disperser and is connected to the material gas supply source. The gas exhaust mechanism is equipped with gas exhaust holes provided at both sides of the base material conveyance region opposite the side where the gas diffuser is disposed, and with a gas venter connected to the gas exhaust holes. The gas diffuser and the gas exhaust holes oppose each other with the base material conveyance region therebetween. The CVD reactor may be used to produce an oxide superconductive conductor by forming a superconductive layer at the surface of a base material while adjusting the flow of gas around the base material.

15 Claims, 13 Drawing Sheets

CHEMICAL VAPOR DEPOSITION REACTOR AND METHOD OF PRODUCING OXIDE SUPERCONDUCTIVE CONDUCTOR USING THE SAME

This is a Continuation of application Ser. No. 08/516,193 filed Aug. 17, 1995, now abandoned.

BACKGROUND OF THE INVENTION

The present invention relates to a chemical vapor deposition (CVD) reactor which forms a film of good quality on the surface of a base material, and to a production method for an oxide superconductive conductor which uses this CVD reactor.

BACKGROUND ART

The chemical vapor deposition method is widely known conventionally as a method which, as compared to a vacuum deposition method or a physical vapor deposition method such as spattering, enables the formation at high speed of a thin film on a base material which has a large surface area, without requiring numerous limitations of the shape of the base material. However, this CVD method does have numerous specific control parameters required that are not seen in other film forming methods. These include, for example, control of the prepatory composition and supply speed of the material gas, the type of carrier gas, the amount of reactant gas supplied, and the flow of gas in the film formation chamber, this being influenced by the structure of the reaction reactor. For this reason, the CVD method presents a disadvantage in that it is difficult to optimize these various conditions in order to carry out the formation of a thin film of good quality using the method.

A variety of structures are conventionally known for the reaction reactor in this type of CVD reactor, and may be employed in response to objectives ranging from production to experimental purposes. CVD device A, having the structure shown in FIG. 23, however, is given here as an example of the CVD device which is most widely known generally for use in forming a thin film.

The CVD device A of this example is composed of a long reaction pipe 1, a base plate holder 3 which is provided inside reaction pipe 1 and is equipped with base plates 2, a heater 4 which is provided near reaction pipe 1, a material gas supply source 5 which is connected to one side of reaction pipe 1, and a gas exhaust 6 which is connected to the other side of reaction pipe 1. A device of this type is generally referred to as a "hot wall type" device.

Further, as another example of a general CVD reactor, the CVD reactor B, as shown in FIG. 24, is known. This device is composed of a long reaction pipe 7, a heater 8 which is disposed outside reaction pipe 7 to the underside thereof, and a base plate 9 which is provided inside reaction pipe 7 on the bottom thereof. A device of this type is generally referred to as a "cold wall type" device.

Because reaction pipes 1 and 7 in the aforementioned conventional CVD reactors A and B have simple shapes, the temperature of the base plate and the flow of gas inside the reaction pipes can be controlled comparatively easily. Problematic in these devices, however, is the fact that the shape of the base plate is limited by the internal diameter of reaction pipes 1 and 7.

Accordingly, reaction devices A and B cannot be effectively utilized when, for example, it is necessary to form a thin film on the surface of a long base material such as a tape.

Thus, for this reason, an oxide superconductive conductor, wherein an oxide superconductive thin film is formed to the surface of a long base material, cannot be produced using conventional reaction devices A and B.

For this reason, which employing a CVD method to produce a long oxide superconductive conductor, a CVD reactor such as that shown in FIG. 25 which employs a long reaction chamber was conventionally used. The CVD reactor 11 in this example is comprised of a long reaction chamber 12, a material gas supply device 13 connected to the left side of reaction chamber 12, an exhaust pump 14 connected to the right side of reaction chamber 12, a long heater 15 which is disposed at the bottom of reaction chamber 12, and a base material transfer device 16 consisting of a sending drum and a winding drum.

Further, a material gas supply port 17 is formed at the left end of reaction chamber 12. This material gas supply port 17 is connected to the material gas supply device 13 via material gas supply pipe 18. Furthermore, gas exhaust port 19 is formed to the right end of the reaction chamber 12. This gas exhaust port 19 is connected to exhaust pump 14 via gas exhaust pipe 20.

A long base material 21 inside the reaction chamber 12 is transferred by base material transfer device 16 in the direction indicated by the arrows in the figure. The heater 15 is provided to reaction chamber 12 and is designed to heat the long base material 21 that is sent through reaction chamber 12 to a desired temperature.

In producing a long oxide superconductive conductor using the above-described conventional CVD reactor 11, the long base material 21 is sent into reaction chamber 12 by base material transfer device 16. Material gas is then introduced into chamber 12 from material gas supply device 13 via material gas supply pipe 18, resulting in the creation of the desired atmosphere from the material gas inside reaction chamber 12. Following this, long base material 21 which is inside chamber 12 is immediately heated by heater 15, causing the material gas in the vicinity of base material 21 to react. An oxide superconductive thin film is deposited at the surface of base material 21, thus making it possible to produce the oxide superconductive conductor.

However, when employing the above-described conventional CVD reactor 11, base material 21 is introduced into entrance 23 of reaction chamber 12 and simultaneously undergoes rapid heating to high temperatures. Similarly, upon exiting reaction chamber 12 via exit 24, base material 21 simultaneously undergoes rapid cooling by the ambient environment. As a result of the rapid temperature changes which base material 21 undergoes upon entry into and exit from reaction chamber 12, there is a chance that stress from expansion or contraction caused by the rapid changes in temperature which the base material 21 encounters at entrance 23 and exit 24 of reaction chamber 12 could be placed on the oxide superconductive thin film. Commonly-known oxide superconductive thin films hold up poorly under the application of stress, and depending on the size of the stress, may also suffer a large reduction in their critical current density.

Furthermore, in the above-described conventional CVD reactor 11, material gas which has entered into reaction chamber 12 from material gas supply port 17 immediately begins decomposition around the heated base material 21, starting the generation of a thin film at the surface of base material 21. However, following completion of decomposition and the generation of the thin film, gas still remains inside reaction chamber 12. This remaining gas remains around base material 21 until it reaches gas exhaust port 19 and is expelled. Accordingly, because of the effects of this remaining gas, there is a concern that a thin film may be deposited at the surface of base material 21 which has a composition different from that which is desired.

Accordingly, it is difficult to obtain a thin film which has a stable film quality and uniform composition along the length of a long base material. When, for example, a film is formed having a considerably impaired superconductive characteristics because of a deviation from the desired composition, it is not possible to obtain an oxide superconductive conductor having a stable film quality along the length thereof with the conventional CVD reactor device 11.

SUMMARY OF THE INVENTION

Accordingly, the present invention was conceived in consideration of the aforementioned circumstances, and has as an object thereof to provide a CVD reactor which can form a thin film, such as an oxide superconductive thin film, having a stable composition and film quality along the length of a long base material. Additionally, it is a further object of the present invention to provide a method of production for an oxide superconductive conductor.

The CVD reactor of the present invention is provided with a reaction chamber where a CVD reaction is carried out by causing the chemical reaction of a material gas so that reaction products are deposited at the surface of a base material; a material gas supply mechanism which supplies material gas into the processing chamber; and a gas exhaust mechanism which vents the gas inside the processing chamber. In this CVD reactor, the processing chamber is divided by partitions into a base material introduction section, a reaction chamber, and a base material guide out section. A base material transit opening is formed in each partition, and a base material conveyance region that passes through the base material introduction section, the reaction chamber, and the base material guide out section, is formed inside the reaction chamber. The material gas supply mechanism is provided with a material gas supply source and a gas disperser which is provided to one side of the reaction chamber and is connected to the material gas supply source. The gas exhaust mechanism is equipped with gas exhaust holes provided at both sides of the base material conveyance region opposite the side where the gas diffuser is formed, and with a gas exhauster that is connected to the gas exhaust holes. The gas diffuser and the gas exhaust holes are constructed so as to oppose one another with the base material conveyance region interposed therebetween.

In the present invention, it is preferable that the gas diffuser be equipped with a gas diffuser member which widens toward one end and is attached to part of the reaction chamber of the processing chamber, and with a jet portion for the material gas that is attached to the top of the gas diffuser member.

In the present invention, it is preferable that the base material conveyance region be provided cutting across the center of the processing chamber, with gas exhaust holes formed at least at the boundary between the base material introduction section and the reaction chamber and at the boundary between the reaction chamber and the base material guide-out section.

In the present invention, it is preferable that the base material conveyance region be provided cutting across the center of the processing chamber, while at the same time the gas exhaust holes be formed in the shape of a slit extending from the side of the base material introduction section nearest the reaction chamber, passing through the reaction chamber, to the side of the base material guide-out section nearest the reaction chamber.

In the present invention, it is preferable that the gas exhaust holes formed at the boundary between the base material introduction section and the reaction generation chamber open on both the base material introduction section side and the reaction generation chamber side, while the gas exhaust holes formed at the boundary between the reaction chamber and the base material guide out section open on both the reaction chamber side and the base material guide-out section side.

In the present invention, it is preferable in the above-mentioned CVD reactor that the reaction chamber be segregated into a plurality of reaction chambers via partitions, and that each of the segregated reaction chambers be respectively provided with a material gas supply mechanism.

In the present invention, it is preferable in the above-mentioned CVD reactor that the gas diffuser have a supply pipe attached to the material gas supply source, and that an expulsion nozzle be provided to the opening at the gas diffuser side of the supply pipe.

In the present invention, it is preferable in the above-mentioned CVD reactor that the gas diffuser be connected to the ceiling of the reaction chamber via a rectangular shaped opening, with the width of the opening of the gas diffuser along the direction of the width of the reaction chamber being formed to be almost identical to the base material transfer region. At the same time, it is also preferable that the gas diffuser be provided with a front wall inclined toward the base material introduction section, a rear wall inclined toward the base material guide-out section, and side walls which connect these front and rear walls.

In the present invention, it is preferable in the above-mentioned CVD reactor that the partition which divides the base material introduction section and the reaction chamber be inclined in the same direction as the front wall of the gas diffuser, and that the partition which divides the base material guide-out section and the reaction chamber be inclined in the same direction as the rear wall of the gas diffuser.

In the present invention, it is preferable that in the above-mentioned CVD device the partition which divides the base material introduction section and the reaction chamber be inclined so as to be in the same plane as the front wall of the gas diffuser, and that the partition which divides the reaction chamber and the base material guide-out section be inclined so as to be in the same plane as the rear wall of the gas diffuser.

In the present invention, it is preferable in the above-described CVD device that the gas diffuser be formed in the shape of a truncated pyramid, In the above-described CVD device, it is preferable that the base material introduction section, the reaction chamber, and the base material guide-out section all be formed of quartz.

In the production method for an electric conductor for use in oxidation according to the present invention, it is preferable to use a CVD reaction device of the above-described construction, wherein the base material is sent into the base material conveyance region of the CVD reactor, the material gas for generating an oxide superconductor is supplied from the material gas supply source to the reaction chamber, and at the same time the base material is heated and reaction products are deposited onto its surface.

In the method of the present invention, it is preferable that the CVD reaction device employed be one in which the material gas which was sent into the reaction chamber via the gas diffuser from the aforementioned material gas supply source is vented from the gas exhaust holes, and a flow of material gas is generated which flows across the base material from the gas diffuser at one side of the reaction chamber to the gas exhaust holes at the other side of the reaction chamber as reaction products are deposited to the surface of the base material.

BRIEF DESCRIPTION OF THE DRAWINGS

FIG. 8A is a profile diagram of the CVD reactor shown in FIG. 6, while

FIG. 8B is a cross-sectional diagram showing the jet nozzle of the CVD reactor shown in FIG. 6.

DESCRIPTION OF THE PREFERRED EMBODIMENTS

A detailed description of the present invention will now be given with reference being made to the figures.

Figure 1:
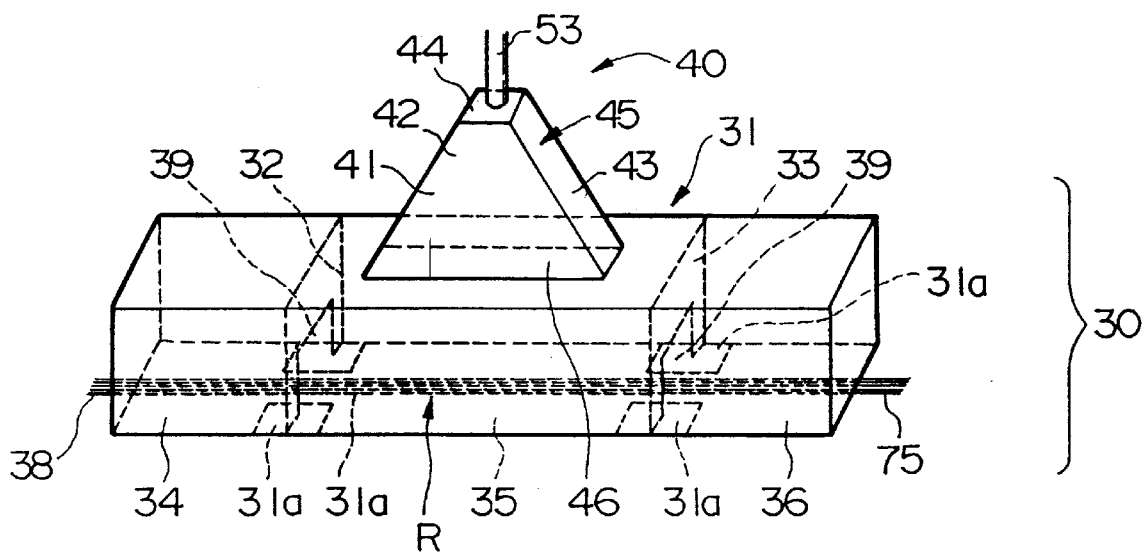
FIG. 1 is a schematic diagram showing a first structural example of the CVD reactor used in the production of a superconductive conductor according to the present invention.

FIG. 1 is an inclined view diagram showing the structure of the elements of a first structural example of the CVD reactor according to the present invention. The CVD reactor 30 in this example is employed in the production device for an oxide superconductive conductor shown in FIG. 3.

The CVD reactor 30 of this example has a tubular quartz processing chamber 31 which is closed at both ends along its horizontal length. This processing chamber 31 is divided into, in order from the left side of FIG. 1, a base material introduction section 34, a generation chamber 35, and a base material guide out section 36, by the partitions 32 and 33. Additionally, it is noted here that the material which comprises processing chamber 31 is not limited to quartz, but may be a metal, such as stainless steel, which has excellent anti-corrosive characteristics.

Further, transit openings 39 through which a base material 38 in the form of a tape can pass are respectively formed in a center positions of partitions 32 and 33 at the bases thereof. Base material conveyance region R is formed inside processing chamber 31, cutting across the center thereof. Further, an introduction hole for introducing a base material 38 in the form of a tape is formed in base material introduction section 34. A guide-out hole for guiding out base material 38 is formed in base material guide-out section 36. Sealing members (not shown in the figure) are provided at the periphery of the introduction and guide-out holes to close the space interval of each hole when base material 38 is traveling through the device, maintaining base material introduction section 34 and base material guide-out section 36 in an airtight manner.

Further, a triangular gas diffuser 40 is provided at the ceiling of processing chamber 35. This gas diffuser 40 is primarily composed of a gas diffuser member 45 consisting of trapezoidal side walls 41 and 41 which are disposed along the longitudinal direction of processing chamber 31, rear wall 43, and front wall 42 which mutually connect to side walls 41 and 41, and ceiling wall 44. Further, gas diffuser 40 is equipped with a supply pipe 53 which is explained below. Moreover, the bottom of gas diffuser member 45 forms a long thin rectangular shaped opening 46. Gas diffuser member 45 communicates with reaction chamber 35 via this opening 46.

Moreover, gas exhaust holes 31a and 31a are formed to the right and left at the bottom of the CVD reactor at the boundary between base material introduction section 34 and reaction chamber 35, with base material conveyance region R interposed therebetween. These gas exhaust holes 31a straddle base material introduction section 34 and reaction chamber 35. Gas exhaust holes 31a and 31a of the same structure are also formed in the bottom of the CVD reactor at the boundary between reaction chamber 35 and base material guide out section 36.

Figure 3:
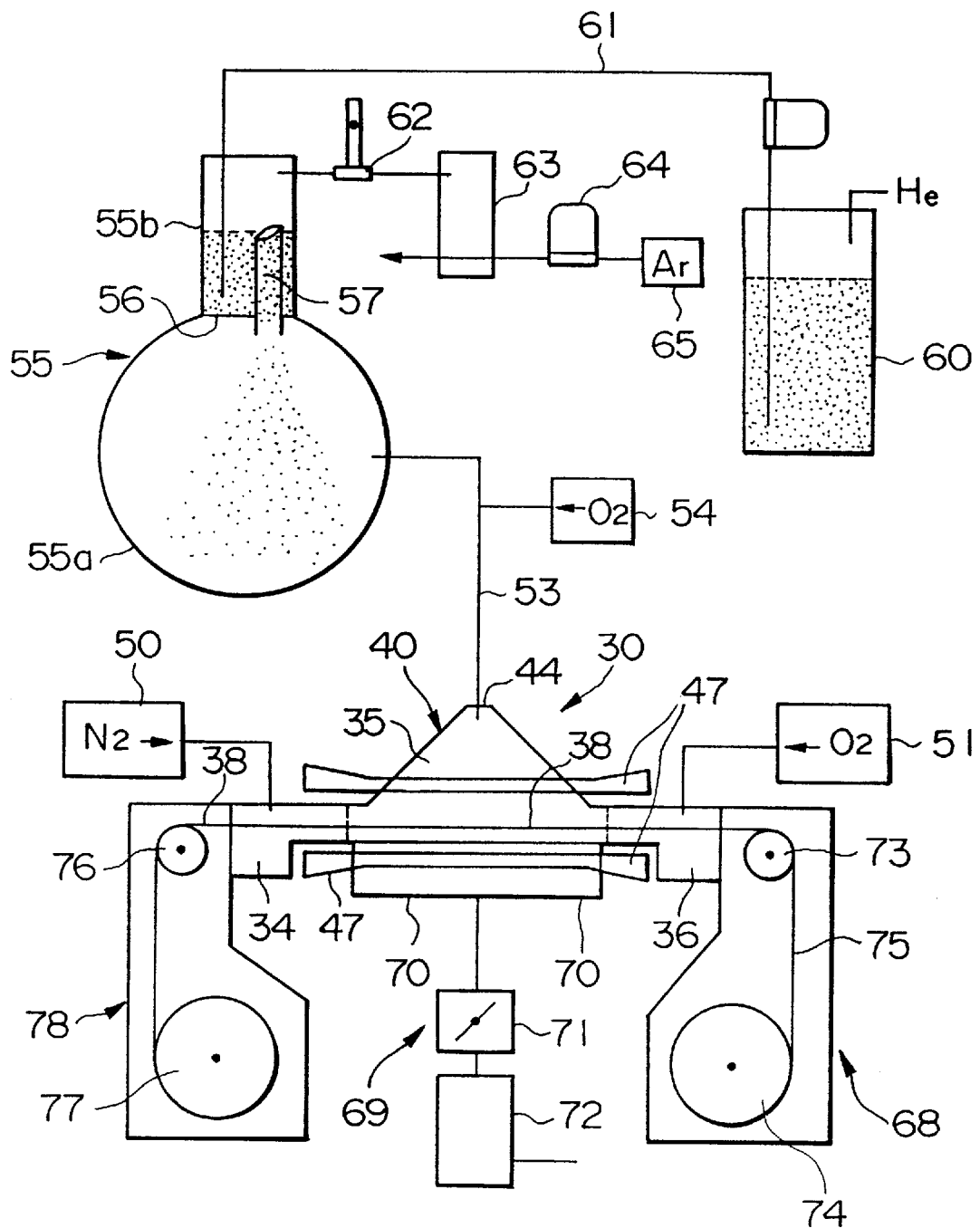
FIG. 3 is a schematic of the complete structure of an oxide superconductive conductor equipped with the CVD reactor shown in FIG. 1.

As shown in FIG. 3, heaters 47 are provided outside CVD reactor 30, covering from the portion of base material introduction section 34 nearest the reaction chamber 35, to the portion of base material send-out section 36 nearest reaction chamber 35. Base material introduction section 34 is attached to inert gas supply source 50, while base material guide-out section 36 is attached to oxygen gas supply source 51. Further, supply pipe 53 is attached to the ceiling wall 44 of gas diffuser 40, this supply pipe 53 connecting to a vaporizer 55 for the material gas (i.e., the material gas supply source). Additionally, it is noted here that an oxygen gas supply source 54 branches off from supply pipe 53 at a point along the length thereof, so that oxygen can be supplied into supply pipe 53.

Material gas vaporizer 55 is provided with a spherical trunk portion 55a and a cylindrical head portion 55b. Trunk portion 55a and head portion 55b are divided by partition 56, but are in communication through a needle-shaped needle pipe 57 which is provided passing through partition 56. Further, a material solution is provided into head portion 55b via supply pipe 61 from a material solution tank 60. The material solution inside head portion 55b is filled up to the edge of the upper tip of needle pipe 57. The upper tip of needle pipe 57 is cut at an angle so that the tip is slanted, and material solution is supplied to the trunk portion 55a in the form of droplets formed by this slanted tip.

Additionally, it is noted here that in FIG. 3 the numeral 62 indicates a flow meter that is connected to the head portion 55b of vaporizer 55; numeral 63 indicates an adjustment gas tank connected to flow meter 62; and numeral 64 indicates a flow adjuster connected to an argon gas supply source 65.

Gas exhaust holes 31a and 31a which are provided in the bottom of CVD reactor 30 are connected to pressure adjuster 72 which is equipped with a vacuum pump 71 via an exhaust pipe 70, with the system designed so that the gas inside CVD reactor 30 can be vented from gas exhaust holes 31a and 31a. Accordingly, gas exhaust mechanism 69 is constructed of gas exhaust holes 31a . . . , exhaust pipe 70, vacuum pump 71, and pressure adjuster 72.

Further, a base material conveyance mechanism 68 comprising a tension drum 73 and winding drum 74 for winding base material 38 which passes through base material conveyance region R inside CVD reactor 30 is provided to the lateral side of base material guide out section 36 of CVD reactor 30. Further, a base material conveyance mechanism 78 consisting of a tension drum 76 and a send-out drum 77 for supplying base material 38 to CVD reactor 30 is provided to the lateral side of base material guide-out section 34.

An explanation will now be made of the production of an oxide superconductive conductor by forming an oxide superconductive thin film at the surface of a base material 38 which is in the form of a tape using an oxide superconductive conductor production device equipped with a CVD reactor 30 having the above construction.

In order to produce an oxide superconductive conductor using the production device shown in FIG. 3, a base material 38 in the form of a tape and a material solution must first be prepared.

Base material 38 may be long. More particularly, however, a base material wherein an intermediate layer made of ceramic is coated onto the surface of a metallic tape which has a low coefficient of thermal expansion, is preferable. A metal material or alloy such as silver, platinum, stainless steel, copper, hastelloy (C276 etc.) or the like are preferable as the material composing the heat resistant metal tape. Further, in addition to metal tapes, tapes consisting of a variety of glass tapes or a variety of ceramics, such as mica tape, may be used. Ceramics such as YSZ (yttrium stabilized zirconia), $SrTiO_3$, MgO, $Al_2O_3$, $LaAlO_3$, $LaGaO_3$, $YAlO_3$, $ZrO_2$ or the like, which have a coefficient of thermal expansion that is closer than that of metals to the coefficient of thermal expansion of an oxide superconductor, are preferable for the material composing the aforementioned intermediate layer. From among these, however, it is preferable to use the substance that has the most orderly crystal orientation possible.

With regard to the material solution for generating the oxide superconductive conductor in a CVD reaction, it is preferable that metal complexes of each element composing the oxide superconductor be dispersed in solvent. Specifically, when forming the well-known yttrium-derived oxide superconductive thin film having the composition $Y_1Ba_2Cu_3O_{7-x}$, Ba-bis-2,2,6,6-tetramethyl-3,5-heptane dion-bis-1,10-phenanthrene $(Ba(thd)_2(phen)_2)$, $Y(thd)_2$, $Cu(thd)_2$ or the like can be used. In addition, Y-bis-2,2,6,6-tetramethyl-3,5,heptane dionate $(Y(DPM)_3)$, $Ba(DPM)_2$, $Cu(DPM)_2$ or the like can be used.

In addition to Y-based compounds, a number of types of superconductive thin films such as La-based compounds represented by the composition $La_{2-x}Ba_xCuO_4$, Di-based compounds represented by the composition $Bi_2Sr_2Ca_{n-1}Cu_nO_{2n+2}$ (where n is a natural number), Tl-based compounds represented by the composition $Tl_2Ba_2Ca_{n-1}Cu_nO_{2n+2}$ (where n is a natural number), and the like are known. Accordingly, the CVD method may be carried out using a metal complex chosen in response to the desired composition.

For example, when producing an oxide superconductive thin film which is derived from an element other than yttrium, in response to the necessary composition system, a metal complex such as triphenyl bismas (III), bis(dipivalic methanate) strontium(II), bis(dipivalic methanate) calcium (II), tris(dipivalic methanate) lanthanum(III) or the like may be appropriately used to produce oxide superconductive thin films derived respectively from the different elements.

After preparing the tape-type base material 38, it is sent from base material introduction section 34 through base material conveyance region R inside CVD reactor 30 at a fixed traveling speed by base material conveyance mechanism 78, and is wound by the winding drum 74 of base material conveyance mechanism 68. Further, base material 38 inside reaction generation chamber 35 is heated to a fixed temperature by heater 47. Additionally, it is noted here that before sending base material 38, it is preferable to send inert gas from inert gas supply source 50 into CVD reactor 30 to act as a purge gas, while simultaneously releasing the gas inside CVD reactor 30 through gas exhaust holes 31a, 31a, 31a, and 31a by means of pressure adjustment device 72. Unnecessary gases such as air or the like inside CVD reactor 30 are thereby eliminated, and the inside portion of CVD reactor 30 is purged.

Once base material 38 is sent inside CVD reactor 30, oxygen gas is sent into CVD reactor 30 from oxygen gas supply source 51. Further, material solution from material solution tank 60 is sent to head portion 55b of vaporizer 55, while argon gas is sent to head portion 55b of vaporizer 55 to function as a carrier gas from adjustment tank 63. At the same time, the gas inside CVD reactor 30 is vented through exhaust holes 31a, 31a, 31a, and 31a by pressure adjustment device 72 of gas exhaust mechanism 69. As a result, a difference is generated between the pressure inside head portion 55b of vaporizer 55 and the pressure in trunk portion 55a. Due to this pressure difference, the material solution inside head portion 55b is pulled into needle pipe 57 through the tip thereof. As a result, the material solution can be converted into droplets.

By means of the above operations, a material gas wherein a material in droplet form is included in a carrier gas can be generated. This material gas is supplied to gas diffuser 40 via supply pipe 53 from the trunk portion 55a of vaporizer 55. Further, at the same time, oxygen gas is supplied from oxygen gas supply source 54 and is mixed in with the material gas.

Next, inside CVD reactor 30, material gas which has exited through the exit portion of supply pipe 53 to gas diffuser 40 moves toward the reaction chamber 35 while diffusing along the front wall 42 and rear wall 43 of gas diffuser 40. The material gas passes through the inner portion of reaction chamber 35 and moves so as to be pulled into gas exhaust holes 31a, 31a, 31a, and 31 by vertically cutting across base material 35.

Accordingly, an oxide superconductive thin film can be generated by reacting a material gas on the upper surface of a heated base material 38. Further, in the device of this example, because the remainder of the gas which contributed to the reaction can be immediately vented through the gas exhaust holes 31a ... which are positioned on both side of base material 38, the process of forming the film can be performed without base material 38 being exposed for a long period of time to the gas remaining after the reaction. Accordingly, because an oxide superconductive thin film can be generated using only unreacted pure material gas at the surface of base material 38, an oxide superconductive thin film 75 which has the desired composition and stable film quality can be formed.

Further, because the gas remaining following the reaction is immediately vented via gas exhaust holes 31a ... which are disposed at the lateral side of base material 38, there is no concern that the remaining gas will reach the base material introduction section 34 or the base material guide out section 36. Thus, a thin film, deposition, or reaction product having a composition different than that desired due to the effects of exposure to gas remaining following the reaction is not generated in base material introduction section 34 or base material guide-out section 36.

Accordingly, if a device of the above structure is used, the process of forming a thin film in reaction generation chamber 35 using only a pure material gas of the desired composition can be reliably carried out. An oxide superconductive conductor 75 provided with an oxide superconductive thin film having the desired stable composition and stable film quality can therefore be obtained on the surface of base material 38.

Further, gas exhaust holes 31a and 31a open extending from the side of the base material introduction section 34 closest to reaction chamber 35 to the side of reaction chamber 35 closest to base material introduction section 34. Accordingly, even if, on the rare occasion, gases or unwanted components in the air which do not contribute to the reaction become mixed within base material introduction section 34 at the time of introduction of base material 38, such components or gases can be quickly vented through gas exhaust holes 31a.

Thus, the chance that unwanted gases or substances are mixed into the environment within reaction chamber 35 through base material introduction section 34 is reduced, decreasing the concern that such gases or substances will have a deleterious effect on the break down of the material gas inside reaction chamber 35 and the film formation.

Moreover, when the film is being formed, because as much oxygen is supplied as possible to the oxide superconductive thin film on the base material from the oxygen gas sent from oxygen supply source 51 to base material guide out section 36, it is possible to obtain an oxide superconductive thin film having an even better film quality. Further, the flow of material gas in reaction chamber 35 can be made smooth by achieving a pressure balance through reduction of the pressure difference between reaction chamber 35 and base material guide out section 36 using the oxygen gas sent to base material guide out section 36.

Figure 2:
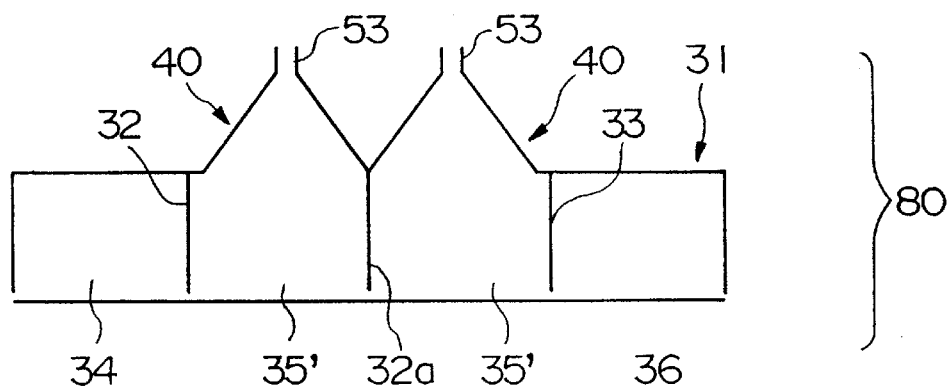
FIG. 2 is a schematic diagram showing a second structural example of the CVD reactor according to the present invention.

FIG. 2 shows a schematic diagram of a second structural example of a CVD reactor according to the present invention. The CVD reactor 80 of this example has a structure wherein the reaction chamber is divided into two reaction generation chambers 35' and 35' by a partition 32', with gas diffusers 40 being provided to these respective reaction generation chambers 35' and 35'. Further, a supply pipe 53 is connected to each gas diffuser 40.

Other structures in this example are identical to the previously described CVD reactor 30. Moreover, identical objectives can be achieved with a CVD reactor 80 having this type of construction.

Additionally, it is noted here that in the device of this example, each reaction generation chamber 35' is formed to have a size identical to that of the single reaction generation chamber 35 in the first structural example described above. For this reason, the production speed of the oxide superconductive conductor 75 may be made twice as fast as the device having the construction of the first structural example, with the other effects being identical to those obtained with the device of the first structural example.

Figure 4:
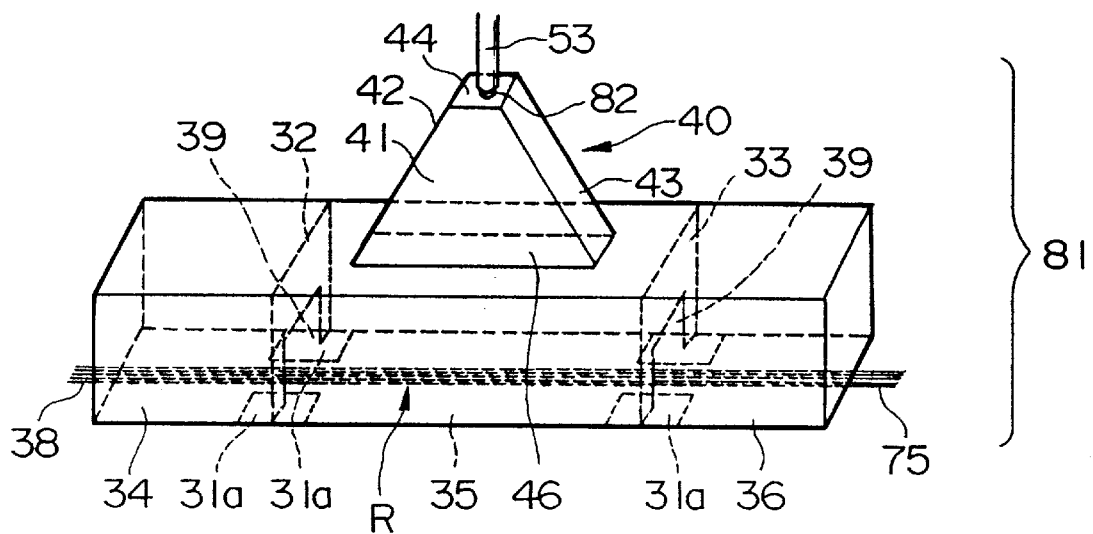
FIG. 4 is a schematic diagram showing a third structural example of the CVD reactor used in the production of a superconductive conductor according to the present invention.

FIG. 4 shows a schematic diagram of a third structural example of a CVD reactor according to the present invention. The CVD reactor 81 of this example differs in structure from the first structural example in that an expulsion nozzle 82 is formed to the end of the material gas supply pipe 53.

The expulsion nozzle 82 used in this example is provided in order to diffuse the material gas more smoothly and more reliably by gas diffuser 40, and diffuse the material gas more uniformly within reaction chamber 35. The inner diameter of expulsion nozzle 82 has a value appropriate to match the volume of reaction chamber 35. Expulsion nozzle 82 smoothes the flow of material gas inside reaction chamber 35 by carrying out jetting of the material gas. Accordingly, it is possible to form a more homogenous oxide superconductive thin film than that obtained with the CVD reactor 30 of the previous example.

More concretely, by setting the inner diameter of expulsion nozzle 82 to be within the range of 3 to 5 mm, an oxide superconductive thin film having a high critical current density can be obtained.

It is noted here that the other effects obtained with CVD reactor 81 are identical to those obtained with the CVD reactor 30 in the previously described first structural example.

Figure 5:
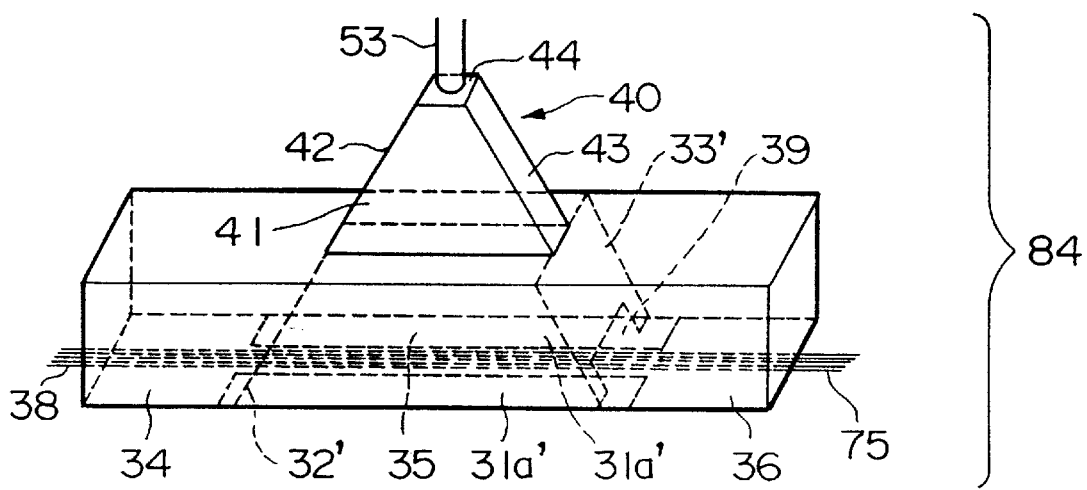
FIG. 5 is a schematic diagram showing a fourth structural example of the CVD reactor used in the production of a superconductive conductor according to the present invention.

FIG. 5 is a schematic diagram of a fourth structural example of a CVD reactor accordingly to the present invention. The CVD reactor 84 in this example differs from the CVD reactor 30 of the first structural example in that the partition 32' which divides reaction chamber 35 and base material introduction section 34, and the partition 33' which divides reaction chamber 35 and base material guide-out section 36 are inclined. CVD reactor 84 also differs from CVD reactor 30 in that gas exhaust holes 31a' are formed in a slit shape extending from base material introduction section 34 near the base of partition 32' to the base material guide-out section 36 near the base of partition 33'.

Moreover, partition 32' is inclined so as to be in the same plane as front wall 42 of gas diffuser 40, while partition 33' is inclined so as to be in the same plane as the rear wall 43 of gas diffuser 40. Further, gas exhaust holes 31a, are designed so that gas is uniformly vented from the entire surface thereof. Additionally, it is noted here that other structures in this CVD reactor 84 are identical to those of the CVD reactor 30 of the first structural example.

In the structure of the CVD reactor in this example, the material gas which was jetted from supply pipe 53 to diffuser 40, spreading along gas diffuser 40, undergoes diffusive movement as it spreads throughout the area between partitions 32' and 33' in reaction chamber 35 under the force of its own flow. Moreover, by means of the structure provided in this example, the material gas can be immediately vented from the long slit shaped gas exhaust holes 31a' and 31a, following its contact with base material 38.

Accordingly, because a thin film is formed at the surface of base material 38 by reacting the material gas, and the gas remaining after the reaction is immediately vented to the outside from almost the entire area of reaction chamber 35 via gas exhaust holes 31a, and 31a', contact between the gas remaining after the reaction and base material 38 and/or the thin film is almost entirely eliminated. As a result, it becomes possible to obtain a thin film layer which has a more uniform composition and a more stable film quality. Moreover, when this thin film is an oxide superconductive thin film, it becomes possible to obtain an oxide superconductive conductor provided with an oxide superconductive thin film which is homogeneous, free from defects and has a high critical current density.

Figure 6:
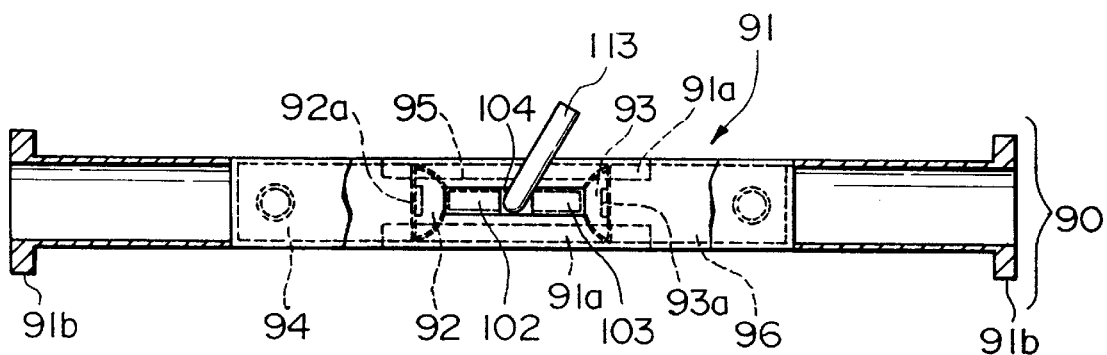
FIG. 6 is a plan view showing a portion of a fifth structural example of the CVD reactor used in the production of a superconductive conductor according to the present invention.
Figure 7:
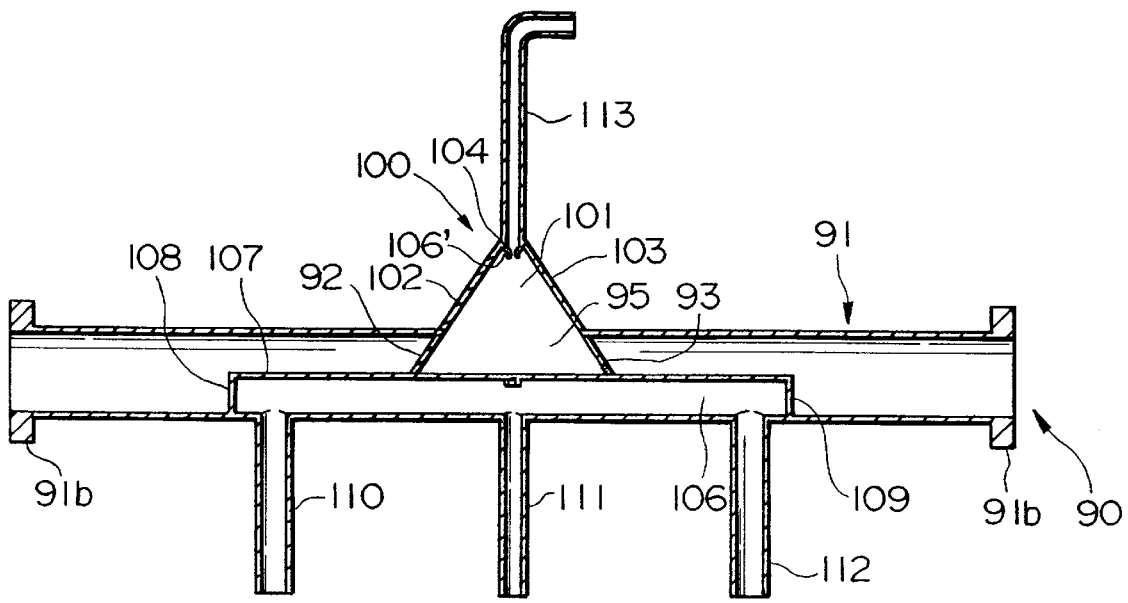
FIG. 7 is a drawing in longitudinal section showing the detailed structure of the CVD reactor shown in FIG. 5.
Figure 8:
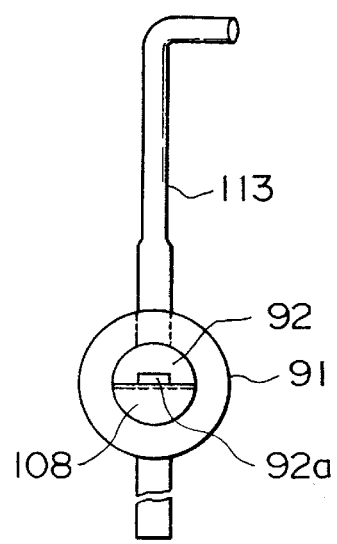
Figure 8:
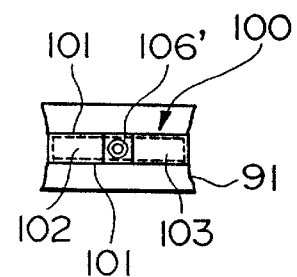

FIGS. 6 through 8 show a fifth structural example of a CVD reactor according to the present invention. The CVD reactor 90 of this construction has a cylindrical quartz processing chamber 91 which is open at both ends. This CVD reactor 90 is constructed so that processing chamber 91 is divided into base material introduction section 94, reaction generation chamber 95 and base material guide-out section 96 by partitions 92 and 93. The CVD reactor of this structure was actually employed in the embodiments which will be described below.

Connecting flanges 91b and 91b are formed to both ends of processing chamber 91 of the CVD reactor 90 in this example. In FIG. 6, an introduction unit provided with an introduction opening for a base material 38 in the form of a tape is attached to the outside of left flange 91b, and a send-out unit provided with an expulsion opening for base material 38 is attached to the outside of the right flange 91b.

In the CVD reactor of this example, a gas diffuser 100 having shape identical to that of the gas diffuser 40 in the first structural example shown in FIG. 1 is formed in the center of processing chamber 91. This gas diffuser 100 is primarily composed of side walls 101, a front wall 102, a rear wall 103, and a ceiling wall 104. Partitions 92 and 93 are inclined so as to be in the same plane as front wall 102 and rear wall 103 respectively.

Further, an exhaust chamber 106 for ventilation that is several times longer than reaction chamber 95 is formed at the bottom of processing chamber 91 in the center thereof. This exhaust chamber 106 is partitioned by a ceiling wall 107 and partitioning walls 108 and 109. Exhaust pipes 110, 111, and 112 are attached to the bottom of exhaust chamber 106 and are attached to the pressure adjustment device 72 shown in FIG. 3.

Further, a supply pipe 113 for connection to the gas vaporizer 55 shown in FIG. 3 is connected to the ceiling wall 104 of gas diffuser 100. A expulsion nozzle 106' is formed at the tip of supply pipe 105. Further, gas evacuation holes 91a and 91a which are positioned on both sides of base material conveyance region R which crosses the center portion of reaction chamber 95 and which communicate between exhaust chamber 106 and reaction chamber 95 are formed at the ceiling wall 107 of exhaust chamber 106 inside reaction chamber 91. These gas exhaust holes 91a are formed so as to reach from the side of base material introduction section 94 closest to reaction chamber 95, through the reaction chamber 95, to the side of base material guide out section 96 closest to reaction generation chamber 95.

The device of the above-described structure provides the same effects as the CVD reactor 84 of the fourth structural example shown in FIG. 5 and described above.

Further, in the structure of this example, because an expulsion nozzle 106' has been provided in addition to making the flow of material gas smoother by inclining partitions 32' and 33', the flow of material gas inside reaction chamber 35 is made even more homogeneous.

Accordingly, if an oxide superconductive conductor is produced using the CVD reactor 90 of this example, an oxide superconductive conductor having an even higher critical current density than in the case where an oxide superconductive conductor was produced using the CVD reactor 84 of the fourth structural example can be obtained.

Figure 9:
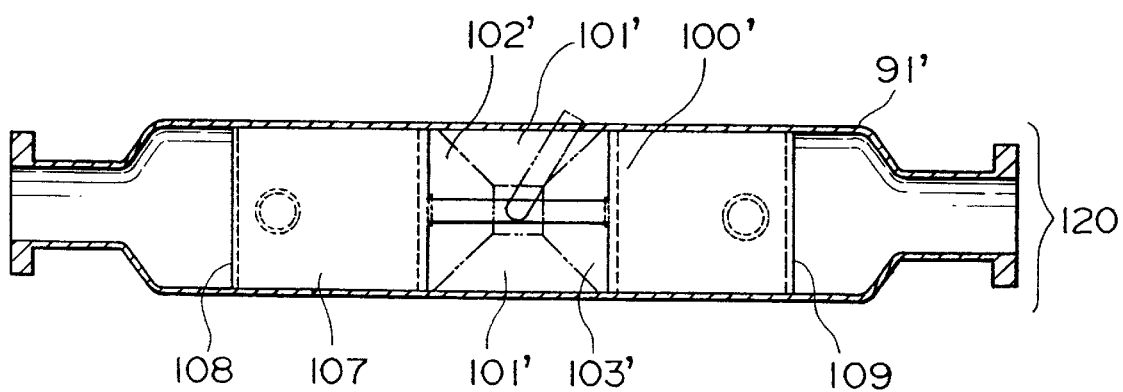
FIG. 9 is a plan view showing a sixth structural example of the CVD reactor used in the production of a superconductive conductor according to the present invention.
Figure 10:
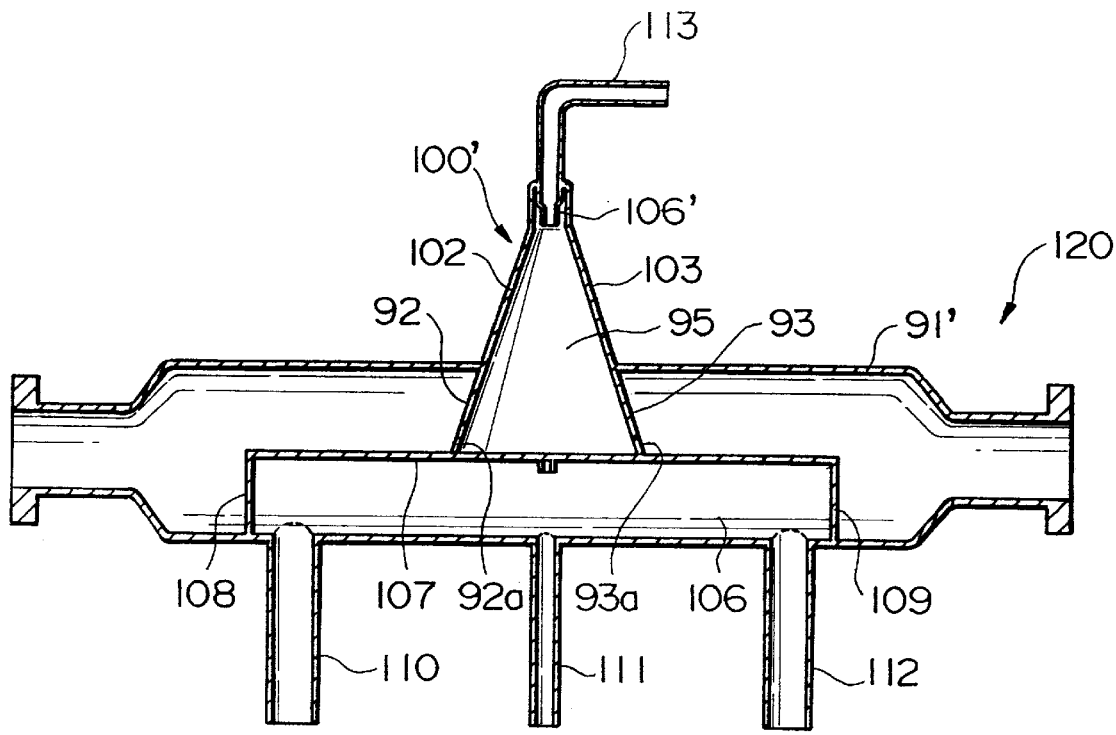
FIG. 10 is a drawing in longitudinal section of the CVD reactor shown in FIG. 9.
Figure 11:
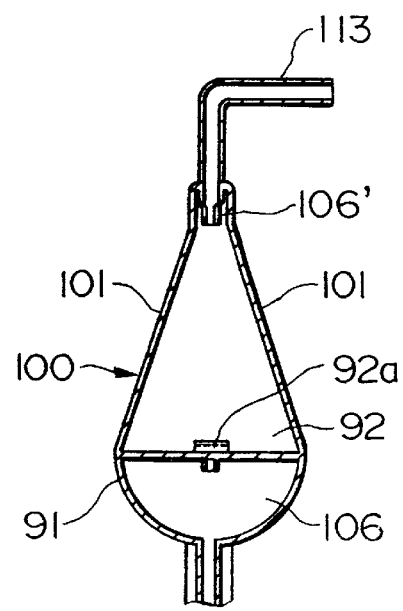
FIG. 11 is a drawing of a horizontal section of the CVD reactor shown in FIG. 9.

FIGS. 9 through 11 show a sixth structural example of a CVD reactor according to the present invention. In CVD reactor 120 of this example, gas diffuser 100' is formed in the shape of a truncated pyramid consisting of inclined rear wall 103', front wall 102', and side walls 101' and 101'. Other structures are basically identical to the CVD reactor 90 in the fifth structural example previously described.

The same effects can be obtained with the CVD reactor 120 of this structural example as those obtained with the CVD reactor 90 previously described.

Figure 12:
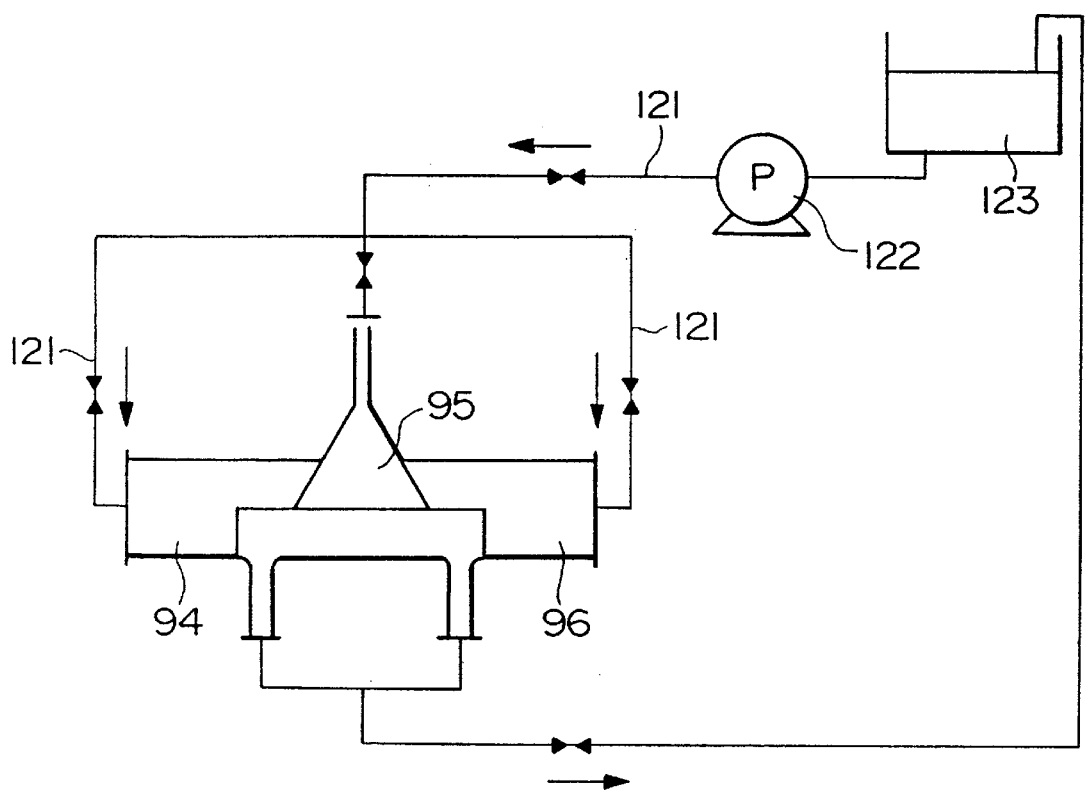
FIG. 12 is a structural diagram showing the device for enabling the visualization of the flow of the material gas inside the CVD reactor shown in FIG. 6.

FIG. 12 shows the structure of a device for analyzing the flow of gas in a CVD reactor 90 having the structure shown in FIGS. 6 through 8.

In this analyzer, a circulation pump 122 and a glycerin tank 123 are connected via respective pipes 121 to the base material introduction section 94, the reaction chamber 95 and the base material guide out section 96. Further, gas exhaust chamber 106 is connected to glycerin tank 123 via pipe 125.

In the device in this example, glycerin liquid with a controlled Reynold's number is sent to CVD reactor 90 in place of the material gas. A simulation of gas flow can then be performed by visualizing how gas would flow through the device from the flow of the glycerin liquid.

Figure 13:
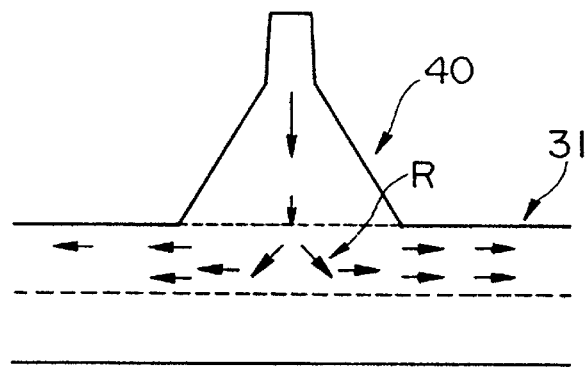
FIG. 13 is a diagram showing the flow of gas inside the CVD reactor shown in FIG. 1.
Figure 14:
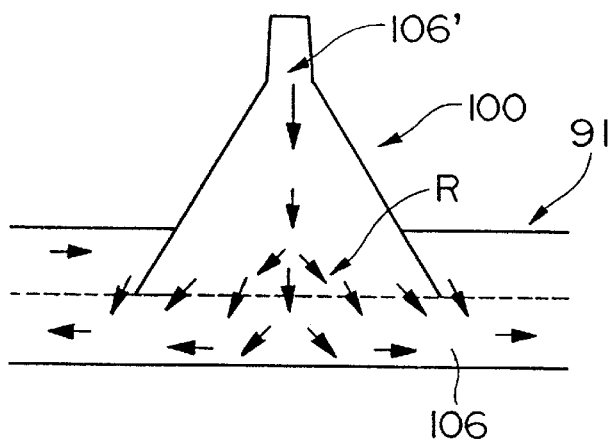
FIG. 14 is a diagram showing the flow of gas inside the CVD reactors shown in FIGS. 6 through 8.

The results of a simulation with glycerin liquid using this device are shown in FIG. 14. For comparative purposes, FIG. 13 shows the results of a simulation performed using CVD reactor 30 having the structure shown in. FIG. 1 wherein a jet nozzle is not provided.

FIG. 13 shows an example wherein a jet nozzle is not provided inside the gas diffuser unit. From this simulation, it may be understood that the glycerin fluid separates into two flows which move along base material conveyance region R, one flow moving toward the front of the conveyance direction of the base material, and the other flow moving toward the rear of the conveyance direction of the base material, before flowing out. FIG. 14 shows an example wherein a jet nozzle has been provided inside the gas diffuser unit. In this example, it is clear that glycerin fluid which has entered into the gas diffuser 100 from jet nozzle 106 passes through base material conveyance region R, after which it immediately separates from base material conveyance region R and moves toward exhaust chamber 106.

It is clear from the above results that the CVD reactor 90 shown in FIGS. 6 through 8 offers more advantageous benefits than the CVD reactor 30 shown in FIG. 1 when it is desired that a thin film be deposited to a base material through the decomposition reaction of a material gas brought into contact with the base material, and the gas remaining following the reaction be immediately removed from the base material after the reaction is completed.

In each of the structural examples described above, an explanation was given of a device having a structure employing a long processing chamber wherein the material gas was moved vertically. However, it should be noted that the processing chamber is not limited to this design but may be long in the vertical direction instead. Similarly, the direction of the gas flow is not limited to up and down, but rather may flow right and left or diagonally. Additionally, the direction of conveyance of the base material may of course be in the left and right directions, or in the up and down directions. Further, the shape of the processing chamber itself is not limited to a cylindrical model, but may be in the form of a box, vessel, sphere, or the like.

As explained above, in the present invention, a reaction chamber is divided into a base material introduction section, a reaction chamber, and a base material guide-out section. A gas diffuser is provided to one side of the reaction generation chamber and gas evacuation holes are provided to the other side of the reaction generation chamber positioned on both sides of the base material conveyance region. Further, the gas diffuser and the gas evacuation holes face each other with the base material conveyance region interposed therebetween. For these reasons, material gas which has exited from the gas diffuser can be expelled via the gas evacuation holes immediately after reacting around the base material. Gas remaining after the reaction does not remain around the base material for a long period of time, thus making it is possible to achieve the formation on the base material of a thin film from pure material gas only. Accordingly, a long thin film of uniform quality can be obtained.

Further, by designing the gas diffuser to be equipped with a gas diffuser member, which is attached to a portion of the reaction chamber of the processing chamber and which has a shape which widens at the end, and a material gas jet which is provided to the tip of the gas diffuser, material gas which has exited from the jet can be smoothly diffused via the gas diffuser, reaching the film formation chamber and being brought into contact with the base material. As a result, the flow of the material gas to the base material can be stabilized, thus stabilizing the supply of material gas at a fixed rate to the base material. Accordingly, it becomes possible to form a thin film of uniform quality to the surface of the base material.

Further, by providing the base material conveyance region so that it cuts across the center of the reaction chamber, and forming gas evacuation holes at at least the boundary between the base material introduction section and the reaction chamber, and the boundary between the reaction chamber and the base material guide out section, the mixing of unwanted gases or particles from the base material introduction section into the reaction chamber is eliminated. Accordingly, deleterious effects caused by unwanted gases or atoms upon the formation of the film in the reaction chamber do not arise. Further, at the same time, because the mixing of material gas or remaining gas into the base material introduction section from the reaction chamber is also prevented, the formation on the base material of a thin film of substandard quality having an irregular composition due to the mixing of material gas into the base material introduction section is eliminated. Further, because the venting of material gas or remaining gas into the base material guide out section is prevented, deposition from the excess remaining gas of a useless thin film having an irregular composition onto the surface of the thin film generated in the reaction chamber can be eliminated. For the preceding reasons, the formation solely within the reaction chamber of a thin film from pure material gas can be realized. Thus, it is possible to generate a thin film of a uniform composition having a stable film quality.

Moreover, by opening on both the base material introduction side and the reaction chamber side the gas evacuation holes which are formed at the boundary between the base material introduction section and the reaction chamber, and by opening on both the reaction generation chamber side and the base material guide out side the gas evacuation holes which are formed at the boundary between the reaction generation chamber and the base material guide out section, the same effects as described above can be obtained.

If the gas evacuation holes are formed in the shape of a slit which extends from the side of the base material introduction section nearest the reaction chamber, through the reaction chamber, to the side of the base material guide out section nearest the reaction chamber, then the gas which remains after the material gas has reacted on the surface of the base material in the reaction chamber can be vented immediately from the gas evacuation holes. Thus, the probability that this remaining gas will come in contact with the base material is decreased. Accordingly, in addition to the effects previously described, the added effect of enabling the formation of a thin film having an even more homogeneous and stable composition is obtained.

Further, in the previously described structure, the reaction chamber is segregated into a plurality of reaction chambers by means of partitions, and material gas supply mechanisms are supplied to each of these reaction generation chambers respectively. As a result, thin films can be sequentially deposited in a plurality of film formation chambers. Accordingly, even if the base material is transferred through the device at a fast speed, a thin film with the same thickness as that obtained in the previously described structure can be formed, thus obtaining the effect of improving the speed of film formation.

In the previously described structure, by providing a jet nozzle to the supply pipe which supplies the material gas to the gas diffuser, the flow of material gas can be made even more uniform. As a result, a thin film having an even more stable film quality can be obtained. Further, by forming the jet nozzle so as to be circular in cross section, and by setting its diameter to be within the range of 3 to 5 mm, a thin film with a further improved homogeneity and film quality can be obtained.

In the previously described device, by providing a construction wherein the gas diffuser is connected to the ceiling of the reaction chamber via a rectangular opening, and the front and rear walls of the gas diffuser are inclined, the diffusive movement of the material gas can be made smooth. Further, by inclining the partition in the reaction chamber in the same direction as the front and rear walls, the material gas which has been smoothly spread out via the gas diffuser smoothly diffuses through the reaction chamber without further manipulation. Thus, the flow of material gas in the reaction chamber can be made smooth and uniform. In this case, if the front wall and one of the partitions are inclined to be in the same plane, and the rear wall and one of the partitions are inclined to be in the same plane, the flow of material gas is made maximally smooth and uniform. Further, by forming the gas diffuser to be in the shape of a truncated pyramid, the flow of the material gas can be made smooth and uniform.

By attaching a material gas supply means for use in the generation of an oxide superconductive conductor to the gas diffuser of a CVD reactor having the structure previously described, a thin film oxide superconductive conductor can be formed to the surface of a base material, thus making it possible to obtain an oxide superconductive conductor.

In the CVD reactor previously described, by providing to the base material conveyance region a base material conveyance mechanism for supplying and drawing out a long base material, a long base material can be sent into the reaction chamber, making it possible to produce a long oxide superconductive conductor.

By using a metallic complex of Y, a metallic complex of Ba, and a metallic complex of Cu as the material gas for use in the generation of an oxide superconductive conductor, it is possible to form an YBaCuO derived oxide superconductive thin film at the surface of a base material.

By using the CVD reactor previously described to send a base material into the base material conveyance region, supplying material gas for generating an oxide superconductor to a reaction chamber from a material gas supplier, and then heating the base material and depositing the reaction products on the base material, it is possible to produce a homogeneous oxide superconductive conductor having a uniform composition.

Further, if the system is designed so that reaction products are deposited to the surface of the base material as material gas which has entered the reaction chamber from the material gas supply source is vented through gas evacuation holes, and a flow of material gas is generated across the base material from one side to the other side of the reaction chamber, then it is possible to form an oxide superconductive thin film at the surface of the base material which is even more homogeneous and has a more ordered composition.

Further, by providing a base material introduction section and a base material guide-out section to both sides of the reaction chamber, manipulating the shape of the gas diffuser which passes through the reaction chamber, and stabilizing the flow of material gas by diagonally inclining the partition which divides the reaction chamber, while at the same time making the amount of material gas supplied more uniform by changing the shape of the expulsion nozzle from a rectangular shaped nozzle to a circular shaped nozzle and setting the diameter of the expulsion nozzle to an optimal value, it is possible to produce with a CVD method an oxide superconductive conductor having the best critical current density currently available for a oxide superconductive conductor having a construction wherein a thin film is formed on a metallic tape base material.

EXAMPLE 1

Ba-bis-2,2,6,6-tetramethyl-3,5-heptane dion-bis-1,10-phenanthrene (Ba(thd)$_2$(phen)$_2$), Y(thd)$_2$, and Cu(thd)$_2$ were used as the material solvent for the CVD reaction in order to form a Y derived oxide superconductive thin film known by the composition consisting of $Y_1Ba_2Cu_3O_{7-x}$. A material solvent was prepared by mixing each of these in a molar ratio of Y:Ba:Cu=1.0:2.4:3.3, and then adding them to a tetrahydrofuran solvent in an amount to comprise 3.0% by weight thereof.

The surface of hastelloy tape of length 300 mm, width 5 mm and thickness 0.2 mm consisting of a type of nickel alloy known by the brand name hastelloy C276 (product of U.S. company Haynes Stellite Co.) was worked to an average surface roughness of Ra≦200 nm. A 0.5 μm thick intermediate layer consisting of YSZ ($Y_2O_3$ stabilized zirconium) was formed to the surface of this hastelloy tape.

A device wherein a quartz CVD reactor 30 having the structure shown in FIG. 1 is incorporated into the oxide superconductive conductor production device shown in FIG. 3 was used. The temperature of the vaporizer was set to 230° C., and the supply speed of the material solution was set to 0.2 ml/min. The traveling speed of the base material tape inside the CVD reactor was set to 20 cm/hr, while the heating temperature for the base material tape was set to 700–800° C. The pressure within the reaction generation chamber was set to 5–10 Torr, and oxygen gas was supplied from the oxygen gas supply source at a rate of 20–30 ml/min. Continuous deposition was then carried out to form a 0.6–1.0 μm thick oxide superconductive thin film having a composition consisting of $Y_1Ba_2Cu_3O_{7-x}$ onto the YSZ intermediate layer.

The opening of the gas diffuser in the CVD reactor used in this example had a width 10 mm and a length of 60 mm. Moreover, the height from the ceiling wall of the gas diffuser to the bottom of the reaction generation chamber, i.e. the distance from the material gas jet to the base material, was 60 mm. Lastly, the inner diameter of the material gas supply pipe was 7 mm, and the film formation region in the reaction generation chamber was 60 mm.

Figure 15:
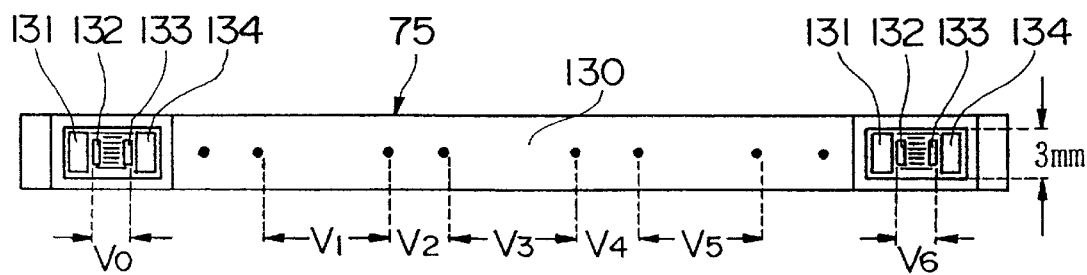
FIG. 15 is a plan view of the oxide superconductive conductor sample obtained in the embodiments.

The thus-obtained oxide superconductive conductor tape is shown in FIG. 15. An Ag coating is applied to the center portion of this oxide superconductive conductor using a sputtering device. Silver electrodes 131, 132, 133, and 134 are formed near both ends of the oxide superconductive conductor as shown in FIG. 15. After applying the Ag coating, the oxide superconductive conductor is placed in a pure oxygen atmosphere and heated at 500° C. for 2 hours to obtain a measurement sample.

A four-terminal method in which the critical current densities were measured by applying suitable voltages to each of the sites $V_0$, $V_1$, $V_2$, $V_3$, $V_4$, $V_5$ and $V_6$ sequentially from the left end of the sample as shown in FIG. 15, was employed. The sample was cooled in liquid nitrogen to 77K, and the critical current density was measured using the four-terminal method with an external magnetic field of 0 T (tesla). These measurements revealed that a critical current density above $1.0 \times 10^4$ A/cm$^2$ (77K, 0 T) was present at each of the sites along the length of the oxide superconductive conductor.

EXAMPLE 2

A film was formed under the same conditions using a device wherein the CVD reactor of the second structural example shown in FIG. 2 is incorporated into the oxide superconductive conductor production device shown in FIG. 3. The traveling speed of the base material tape was approximately doubled to about 40 cm/hr, obtaining an oxide superconductive thin film having a thickness of 0.6–1.0 μm.

17

EXAMPLE 3

This example employed a device wherein the CVD reactor of the third structural example shown in FIG. 4 is incorporated into the oxide superconductive conductor production device shown in FIG. 3. The base material traveling speed was set to 20–40 cm/hr with all other conditions the same as in Example 1. Oxide superconductive conductors where then produced while varying the inner diameter of the jet nozzle to be 1 mm, 3 mm, 5 mm, and 7 mm for respective samples.

The critical current density of each of the thus-obtained oxide superconductive conductors was measured at 77K and 0 T. For nozzle diameters of 1 mm, 3 mm, 5 mm, and 7 mm, critical current densities of $5.0 \times 10^3$ A/cm$^2$, $2.2 \times 10^4$ A/cm$^2$, $1.5 \times 10^4$ A/cm$^2$ and $1.0 \times 10^4$ A/cm$^2$, respectively, were obtained across the length of the sample.

These results prove that when the distance between the nozzle tip and the base material is 60 mm, a nozzle diameter in the range of 3–5 mm provides good results. Further, it was clear that film formation occurs in an approximately 30 mm area along the direction of the length of the base material when a nozzle having a diameter in the range of 3–5 mm is used. From the preceding, it was determined that, in the device of this example, setting the film formation region to be within 30 mm makes it possible to obtain a better oxide superconductive thin film than in the case where the film formation region is 60 mm or less.

EXAMPLE 4

This example employed a device wherein the CVD reactor of the fourth structural example shown in FIG. 5 is incorporated into the oxide superconductive conductor production device shown in FIG. 3. The base material traveling speed was set to 15 cm/hr with all other conditions the same as in Example 1. Film formation was then carried out, obtaining an oxide superconductive conductor sample.

Additionally, in the device of this example, a nozzle in the form of a 4×6 mm rectangularly shaped slit which is attached to the tip of supply pipe 53 was employed.

Figure 16:
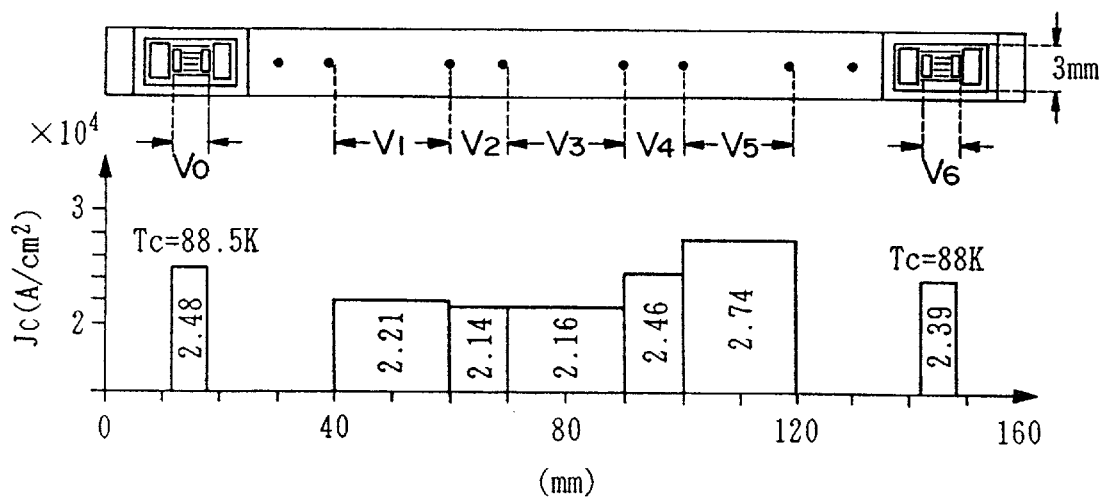
FIG. 16 is a diagram showing the oxide superconductive conductor samples obtained in embodiment 4 and the critical current density at each position.

Voltage was applied on the sample at each of the sites indicated by $V_0$, $V_1$, $V_2$, $V_3$, $V_4$, $V_5$ and $V_6$ in FIG. 16. The critical current densities obtained at each of these sites are shown in FIG. 16.

From these results, it was clear that the oxide superconductive conductor obtained using the device of this example displayed superior critical current densities in the range of $2.14–2.74 \times 10^4$ A/cm$^2$, values which were higher than those obtained using the devices of the previous examples.

Figure 17:
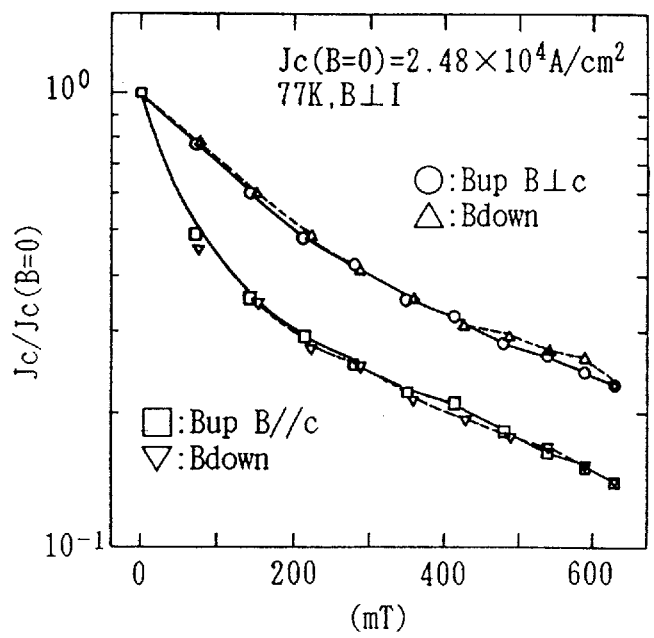
FIG. 17 is a diagram showing the dependence on magnetic field of the critical current density of the oxide superconductive conductor samples obtained in embodiment 4.

Next, the dependence on magnetic field of the critical current density of the aforementioned oxide superconductive conductor sample was measured. These results are shown in FIG. 17.

From these results, it became clear that the rate of decline in the critical current density with respect to external magnetic field applications of up to 600 mT was low for the oxide superconductive conductor obtained in this example. Accordingly, it was clear that the oxide superconductive conductor of this example had sufficient strength with respect to magnetic field applications.

Figure 18:
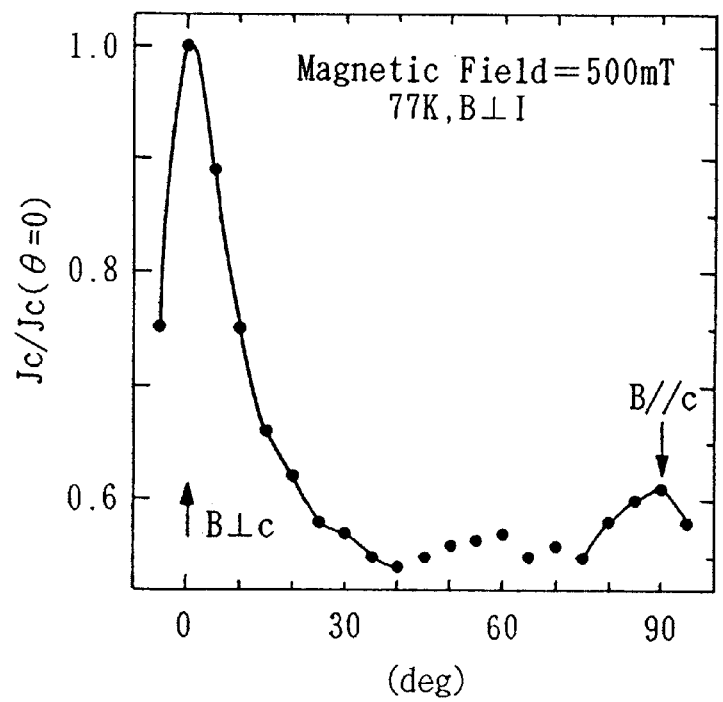
FIG. 18 is a diagram showing the dependence on applied magnetic field direction of the critical current density of the oxide superconductive conductor samples obtained in embodiment 4.

The critical current density characteristics with respect to the direction of application of the magnetic field under an external applied magnetic field of 500 mT are shown in FIG. 18 for an identical sample.

From the results shown in FIG. 18, it became clear that, regardless of the direction in which the magnetic field was applied, the rate of decline in the critical current density was roughly constant, indicating that dependence on magnetic field direction is slight.

EXAMPLE 5

This example employed a device wherein the CVD reactor of the fifth structural example shown in FIGS. 6–8 is incorporated into the oxide superconductive conductor production device shown in FIG. 3. A plurality of base materials were prepared by forming a 0.5 μm thick YSZ intermediate layer to a plurality of metallic tapes which consisted of hastelloy C276 and measured 0.2 mm in thickness and 5 mm in width, with respective varying lengths of 200 mm, 160 mm, and 120 mm. Oxide superconductive thin films having a composition consisting of $Y_1Ba_2Cu_3O_{7-x}$ with thicknesses in the range of 0.8–1.0 μm were formed to the surface of these base materials. The base material traveling speed was set to 20 cm/hr, with all other conditions identical to the preceding Example 1. Film formation was then carried out, obtaining a plurality of oxide superconductive conductors.

Figure 19:
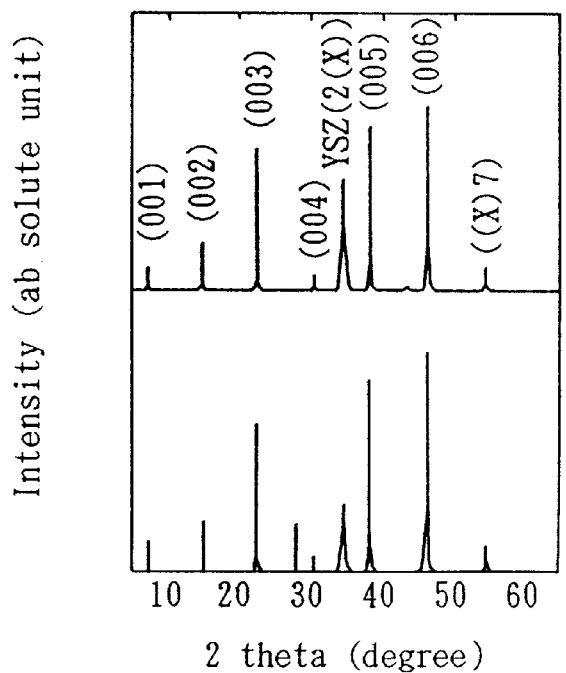
FIG. 19 is a diagram showing the X-ray diffraction peaks of the oxide superconductive conductor samples obtained in embodiment 5.

The X-ray diffraction patterns at both ends of the 200 mm long oxide superconductive conductor obtained are shown in FIG. 19. Strong diffraction peaks are almost aligned between the upper and lower diffraction diagrams in FIG. 19. Further, a peak (OOL) associated with a YBaCuO derived oxide superconductive conductor can be predominantly seen in both diffraction patterns.

Accordingly, from these results, it is clear that the composition at both ends of the thus-obtained oxide superconductive conductor samples is almost uniform. Thus, using the device of this example, a long oxide superconductive conductor homogeneous along its length can be produced.

Further, the sample in this example showed an excellent value of 80–90K for the critical temperature.

Figure 20:
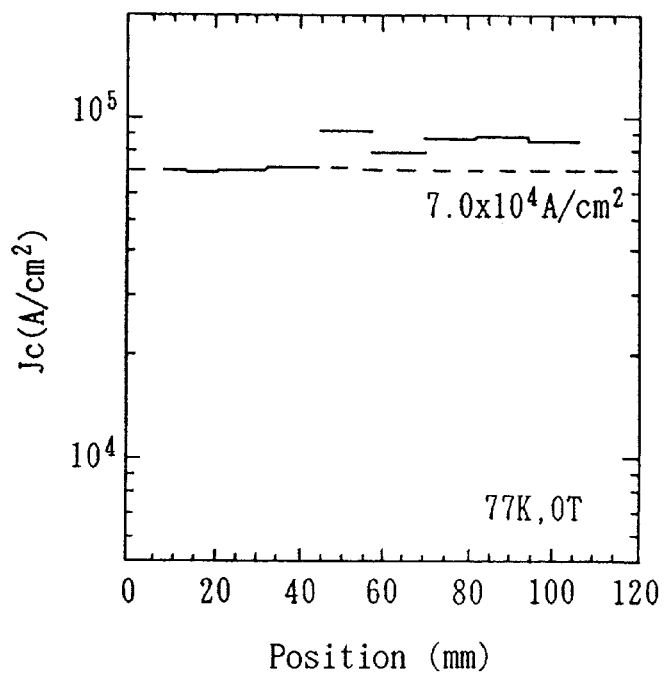
FIG. 20 is a diagram showing the critical current density at each position for the oxide superconductive conductor samples obtained in embodiment 5.
Figure 21:
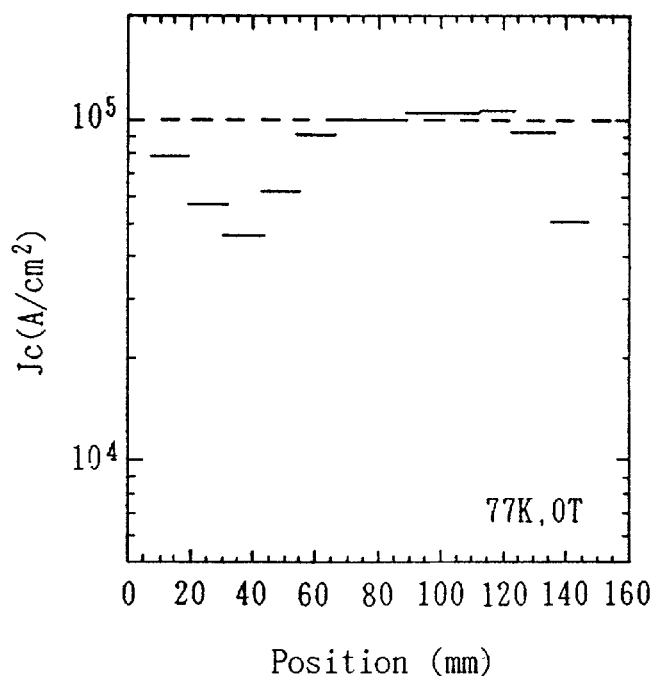
FIG. 21 is a diagram showing the critical current density at each position for the oxide superconductive conductor samples obtained in embodiment 5.

Next, critical current characteristics of the samples were measured. The critical current characteristics along the length of the 120 mm sample are shown in FIG. 20, while the critical current characteristics along the length of the 160 mm sample are shown in FIG. 21. As shown in FIG. 20, the sample of this example is long, and displays an extremely high critical current density of greater than $7.0 \times 10^4$ A/cm$^2$, which is not seen in the conventional art. Further, numerous parts of the sample in FIG. 20 displayed critical current densities with values near $1.0 \times 10^5$ A/cm$^2$. Further, some parts of the sample in FIG. 21 displayed values in excess of $1.0 \times 10^5$ A/cm$^2$.

Further, it was possible to run voltages in the range of 4–5 A through these samples.

These critical current values reach the critical current value of $1 \times 10^5$ A/cm$^2$ which is acknowledged as necessary when utilizing an oxide superconductive conductor in practical applications as a conductor. The implications of being able to offer an oxide superconductive conductor of the type in this example are considerable. Moreover, the oxide superconductive conductor of this example shows a markedly high critical current density when compared to all long oxide superconductive conductors of the conventional art.

Figure 22:
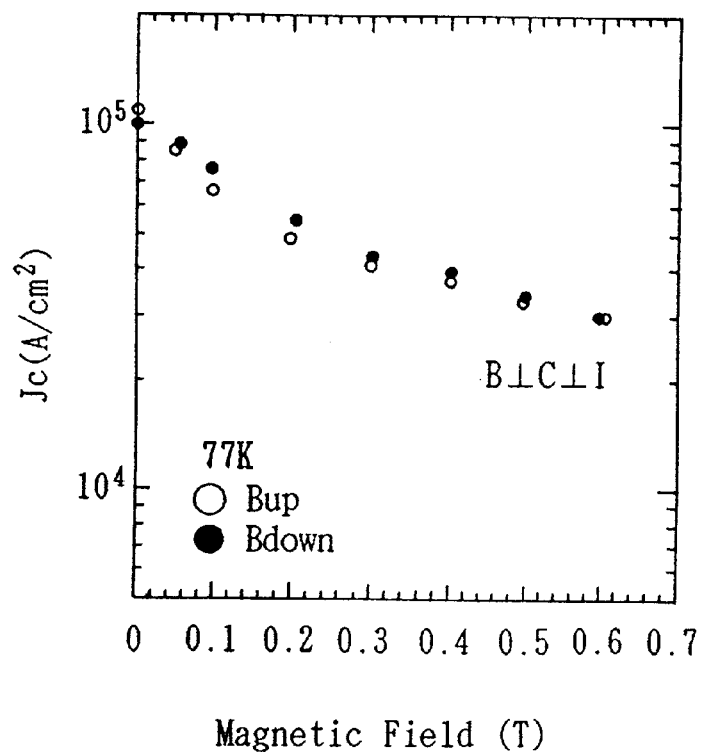
FIG. 22 is a diagram showing the characteristics when a magnetic field is applied to the oxide superconductive conductor samples obtained in embodiment 5.
Figure 23:
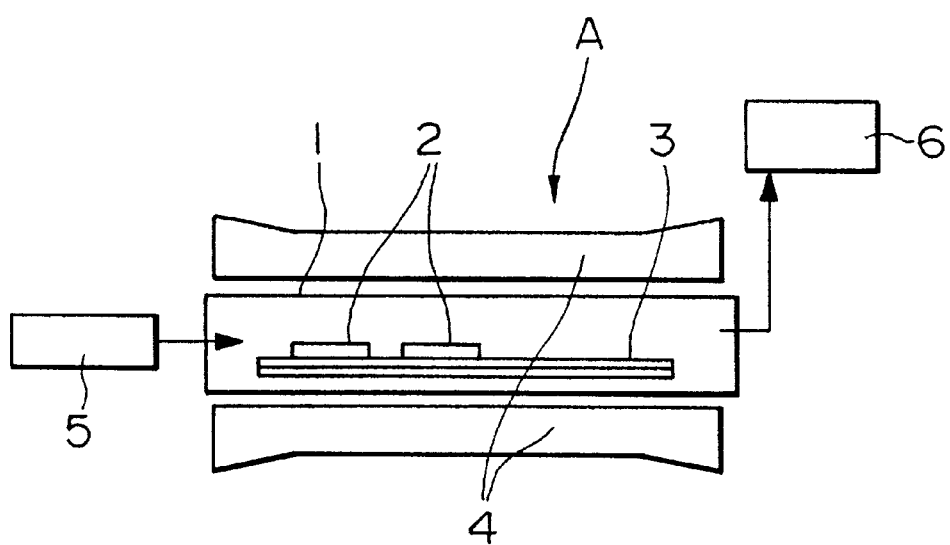
FIG. 23 is a diagram showing a first structural example of a conventional CVD reactor.
Figure 24:
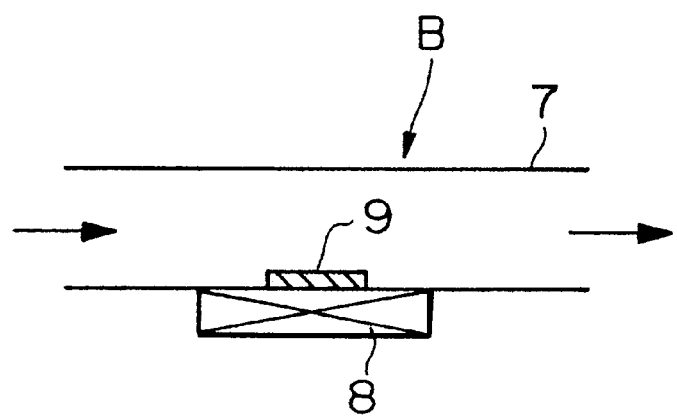
FIG. 24 is a diagram showing a second structural example of a conventional CVD reactor.
Figure 25:
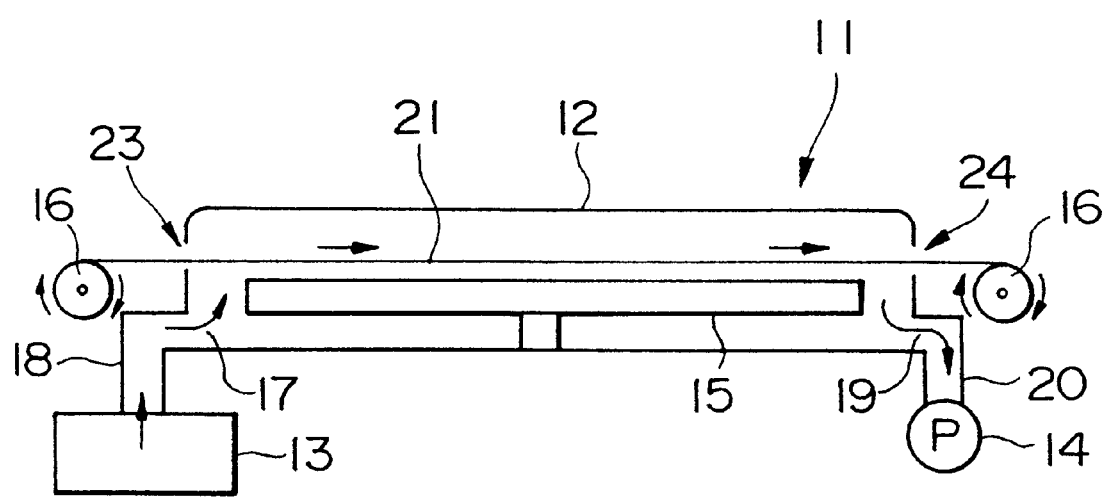
FIG. 25 is a diagram showing a third structural example of a conventional CVD reactor.

FIG. 22 shows the results of measurements of the dependence on magnetic field of the critical current density in a sample which displays a critical current density of $1 \times 10^5$ A/cm$^2$ at 0 T and 77K. The sample in this example displays a value above $3 \times 10^4$ A/mm$^2$ under the application of a magnetic field of 600 mT. It was clear that the sample oxide superconductive conductor in this example showed sufficient strength with respect to the magnetic field.

From the preceding, it is clear that by providing a base material introduction section and a base material guide-out section to both sides of the reaction generation chamber, manipulating the shape of the gas diffuser which passes through the reaction generation chamber, and stabilizing the flow of material gas by diagonally inclining the partition which divides the reaction generation chamber, while at the same time making the amount of material gas supplied more uniform by changing the shape of the expulsion nozzle from a rectangular shaped nozzle to a circular shaped nozzle and setting the diameter of the jet nozzle to an optimal value, it is possible to produce with a CVD method an oxide superconductive conductor having the best critical current density currently available for a oxide superconductive conductor having the construction wherein a thin film is formed on a metallic tape base material.

What is claimed is:

1. An apparatus for producing an oxide superconductive tape by preparing an oxide superconductive film on a base material tape, said apparatus comprising:

a processing chamber for carrying out CVD reactions;

a material gas supply means for supplying material gas to the processing chamber;

a gas exhaust means for venting gas inside the processing chamber;

an inert gas supply means for supplying inert gas to the processing chamber;

an oxygen gas supply means for supplying oxygen gas to the processing chamber; and a heater for heating the processing chamber;

wherein the processing chamber is divided by partitions into a base material tape introduction section, the base material tape introduction section being supplied with said inert gas in its interior, a reaction chamber for generating the superconductive film, and a base material tape guide-out section, the base material tape guide-out section being supplied with said oxygen gas in its interior, base material tape transit openings being formed in the partitions, and the processing chamber is at a low pressure;

a base material tape conveyance region is formed inside the processing chamber, extending through the base material tape introduction section, the reaction chamber and the base material tape guide-out section;

the material gas supply means is provided with a material gas supply source and a gas diffuser is connected to the material gas supply means;

the gas exhaust means includes gas exhaust holes provided at both sides of the base material conveyance region with a gas venter connected to the gas exhaust holes;

the gas exhaust hole formed at the partition between the base material tape introduction section and the reaction chamber extends through the tape transit opening in the partition and opens in both the base material tape introduction section and the reaction chamber, while the gas exhaust hole formed at the partition between the reaction chamber and the base material tape guide-out section extends through the tape transit opening in the partition and opens both the reaction chamber and the base material tape guide-out section, the gas diffuser is provided at a top of the reaction chamber and gas exhaust holes are formed in a bottom of the processing chamber, the gas diffuser is provided with a gas diffuser member which widens toward one end and is attached to a part of the reaction chamber of the processing chamber, the gas diffuser member communicates through the ceiling of the reaction chamber via a rectangular opening, the width of the opening of the gas diffuser lying along the direction of the width of the processing chamber being formed so as to be almost identical to the base material tape conveyance region, and the gas diffuser is provided with a front wall which inclines away from the base material introduction section, a rear wall which inclines toward the base material tape guide-out section, and side walls which connect the front wall and the rear wall, the inert gas supply means is connected to the base material tape introduction section, the oxygen gas supply means is connected to the base material tape guide-out section, and the heater provided outside the processing chamber.

2. An apparatus for producing an oxide superconductive tape according to claim 1, wherein a material gas jet portion is provided to the top of the gas diffuser member.

3. An apparatus for producing an oxide superconductive tape according to claim 1, wherein the base material conveyance region extends across the center of the processing chamber and the gas exhaust holes are formed in the shape of a slit extending from the side of the base material tape introduction section nearest the reaction chamber, passing through the reaction chamber, to the side of the base material tape guide-out section nearest the reaction chamber.

4. An apparatus for producing an oxide superconductive tape according to claim 1, wherein the reaction chamber is segregated into a plurality of reaction chambers by at least one partition, and each of the reaction chambers is respectively provided with a material gas supply means.

5. An apparatus for producing an oxide superconductive tape according to claim 1, wherein the gas diffuser is provided with a supply pipe attached to the material gas supply source, and an expulsion nozzle is provided at the opening at the gas diffuser side of the supply pipe.

6. An apparatus for producing an-oxide superconductive tape according to claim 1, wherein the partition which divides the base material tape introduction section and the reaction chamber is inclined in the same direction as the front wall of the gas diffuser, and the partition which divides the base material tape guide-out section and the reaction chamber is inclined in the same direction as the rear wall of the gas diffuser.

7. An apparatus for producing an oxide superconductive tape according to claim 6, wherein the partition which divides the base material tape introduction section and the reaction chamber is inclined so as to be in the same plane as the front wall of the gas diffuser, and the partition which divides the reaction chamber and the base material tape guide-out section is inclined so as to be in the same plane as the rear wall of the gas diffuser.

8. An apparatus for producing an oxide superconductive tape according to claim 6, wherein the gas diffuser is formed in the shape of a truncated pyramid.

9. An apparatus for producing an oxide superconductive tape according to claim 6, wherein the base material introduction section, the reaction chamber, the base material tape guide-out section and the gas disperser are formed of quartz.

10. An apparatus for producing an oxide superconductive tape according to claim 1, wherein a base material tape conveyance mechanism for supplying a base material tape to the base material tape introduction section is provided to the lateral side of the base material tape introduction section.

11. An apparatus for producing an oxide superconductive tape according to claim 1, wherein a base material tape conveyance mechanism for winding a base material tape which passes through the base material conveyance region is provided to one side of the base material guide-out section.

12. An apparatus for producing an oxide superconductive tape according to claim 1, wherein a base material tape conveyance mechanism comprising a supply drum for supplying base material tape to the base material tape introduction section is provided to one side of the base material tape introduction section, and a winding drum for winding a base material tape which passes through the base material conveyance region is provided to one side of the base material tape guide-out section.

13. An apparatus for producing an oxide superconductive tape according to claim 1, wherein an exhaust chamber for ventilation is formed at the bottom of the processing chamber in the center thereof by a top wall and a partitioning wall.

14. An apparatus for producing an oxide superconductive tape according to claim 13, wherein the gas exhaust holes which communicate between the exhaust chamber and the reaction chamber are positioned on both sides of the base material conveyance region which crosses the center portion of the reaction chamber and which communicate between exhaust chamber and reaction chamber are formed at the top wall of the exhaust chamber inside reaction chamber.

15. An apparatus for producing an oxide superconductive tape according to claim 13, wherein an exhaust chamber is attached to a pressure adjustment device.

* * * * *